United States Patent
Tsuk

(10) Patent No.: US 7,350,292 B2
(45) Date of Patent: Apr. 1, 2008

(54) METHOD FOR AFFECTING IMPEDANCE OF AN ELECTRICAL APPARATUS

(75) Inventor: Michael J. Tsuk, Arlington, MA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 351 days.

(21) Appl. No.: 10/986,642

(22) Filed: Nov. 12, 2004

(65) Prior Publication Data

US 2005/0205295 A1   Sep. 22, 2005

Related U.S. Application Data

(60) Provisional application No. 60/554,796, filed on Mar. 19, 2004.

(51) Int. Cl.
*H05K 3/30* (2006.01)

(52) U.S. Cl. .................. 29/832; 29/842; 29/846; 29/854; 174/255; 174/256; 174/261; 174/262; 257/531; 257/534; 257/539; 361/780; 361/792; 361/795; 361/803

(58) Field of Classification Search .......... 29/830–832, 29/842, 846, 854; 174/255, 256, 261, 262; 257/531, 534, 539, 500, 338, 351; 361/780, 361/803, 792–795

See application file for complete search history.

(56) References Cited

U.S. PATENT DOCUMENTS

| | | | |
|---|---|---|---|
| 5,466,892 | A | 11/1995 | Howard et al. |
| 5,483,413 | A | 1/1996 | Babb |
| 5,526,172 | A | 6/1996 | Kanack |
| 5,541,454 | A | 7/1996 | Inoue et al. |
| 5,708,569 | A | 1/1998 | Howard et al. |
| 5,870,274 | A | 2/1999 | Lucas |
| 6,094,116 | A * | 7/2000 | Tai et al. ............... 335/78 |
| 6,353,540 | B1 | 3/2002 | Akiba et al. |
| 6,476,330 | B2 | 11/2002 | Otsuka et al. |
| 6,534,843 | B2 | 3/2003 | Acosta et al. |

(Continued)

FOREIGN PATENT DOCUMENTS

JP   62114102 A * 5/1987

OTHER PUBLICATIONS

Shamik Das et al., "Three-Dimensional Integrated Circuits: Performance, Design Methodology, and CAD Tools," Feb. 2003, six (6) pages.

(Continued)

*Primary Examiner*—Paul Kim

(57) ABSTRACT

A method for affecting an impedance of a portion of an electrical circuit loop in an electrical circuit apparatus includes providing an electrical circuit apparatus having at least a portion of an electrical circuit loop including at least one of at least one trace and at least one via, and providing a layer of magnetic material disposed adjacent at least one of the trace and the via. The trace and the via are operatively connected together to provide electrical communication. Dielectric material is disposed in an operative relationship adjacent at least one of the trace and the via. The layer of magnetic material is disposed in operative relationship near at least one of the trace and the via to affect the impedance of at least one of the trace, the via and the portion of the circuit loop formed by the trace and the via.

12 Claims, 7 Drawing Sheets

U.S. PATENT DOCUMENTS

| | | |
|---|---|---|
| 6,535,398 B1 | 3/2003 | Moresco |
| 6,630,629 B2 | 10/2003 | Otsuka et al. |
| 6,636,406 B1 | 10/2003 | Anthony |
| 2003/0141107 A1* | 7/2003 | Burton ...................... 174/261 |

OTHER PUBLICATIONS

Michael J. Tsuk, "Apparatuses, Systems and/or Methods to Affect Impedance," U.S. Appl. No. 60/554,796, Filed on Mar. 19, 2004.

* cited by examiner

METHOD FOR AFFECTING IMPEDANCE OF AN ELECTRICAL APPARATUS

CROSS-REFERENCE TO RELATED APPLICATIONS

This application claims priority under 35 U.S.C. 119(e) co-pending Application No. 60/554,796 filed on Mar. 19, 2004, which is hereby incorporated by reference.

BACKGROUND OF THE INVENTION

In electrical circuit technologies, many electrical circuit devices or apparatuses, such as printed circuit boards (PCBs) or integrated circuits (ICs), include vias and traces that electrically connect component parts of or connections to and/or within the electrical device. However, as both speeds and circuit board layer counts increase, the transmission line effects of through-hole vias become increasingly important. Impedance and propagation delay are two transmission line effects, and the impedance can significantly impact signal integrity. In a lengthwise conductor of the via type, impedance is the square root of the ratio of inductance per unit length to capacitance per unit length. Also, vias tend to have very large capacitances due to the effects of pads and nearby reference planes. These physical issues may cause the impedance of a via to be much lower than the impedance of the traces on different layers connected by the vias. Such mismatched impedance(s) may lead to signal reflections, which can cause errors and an inability to reach theoretically maximal signal speeds. Signal propagation can be undesirably delayed by the comparative high capacitance of such vias.

Some attempts have been made to decrease such effects by focusing on decreasing the capacitance of the vias. Two such methods have included either removing some of the pads or creating large areas where the nearby reference planes have been removed, known as antipads. Removing unused pads is generally helpful, although pads do provide a mechanical stabilizing effect for the via; and yet, pads are still required on those layers where traces connect. Moreover, large antipads cause difficulty by reducing routing density since it is advisable to route nearby signals over solid sections of the reference planes.

SUMMARY

Disclosed are electrical circuit apparatuses, systems and/or methods, exemplary embodiments including a trace, and at least one via in electrical communication with the trace to form a portion of a circuit loop; and, a layer of a magnetic material buried in the corresponding electrical circuit apparatus and/or system; whereby the layer of magnetic material is disposed adjacent at least one of the trace and the at least one via to affect the impedance thereof or of the portion of the circuit loop.

DETAILED DESCRIPTION

Figure 1:
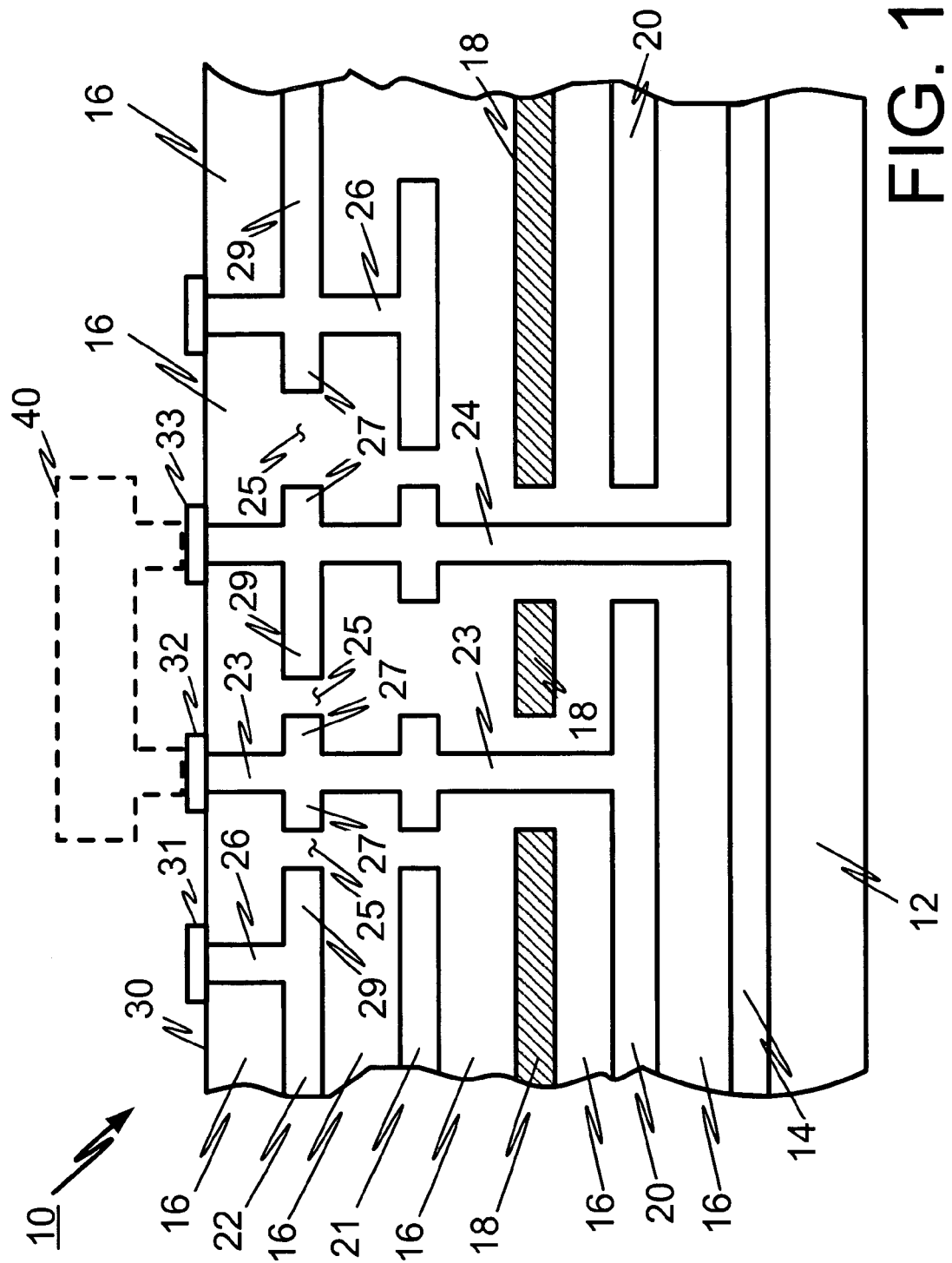
FIG. 1 is a partially broken-away, cross-sectional view of an exemplary embodiment of an electrical circuit apparatus having a magnetic layer buried therein.

The present disclosure involves the inclusion of a layer of magnetic material in an electrical circuit apparatus such as a printed circuit board or integrated circuit device so as to increase the inductance of or in one or more circuits defined within the electrical circuit apparatus. Then, the increased inductance can contribute to and thereby affect or otherwise provide a controlled or balanced impedance, as for example providing a desirable counter-balance to the otherwise large capacitances of some (or all) of the vias in the electrical circuit apparatus. Signals should then not be delayed as they might have been by such unchecked capacitances. Referring to the drawings, FIGS. 1 and 2 show a first embodiment of an electrical circuit device or apparatus 10 having dielectric or insulative materials, e.g., layers 12 and 16, interleaved with conductive materials, e.g., layers 14, 20, 21 and 22, and as shown and described herein, at least one magnetic material, e.g., layer 18.

Figure 2:
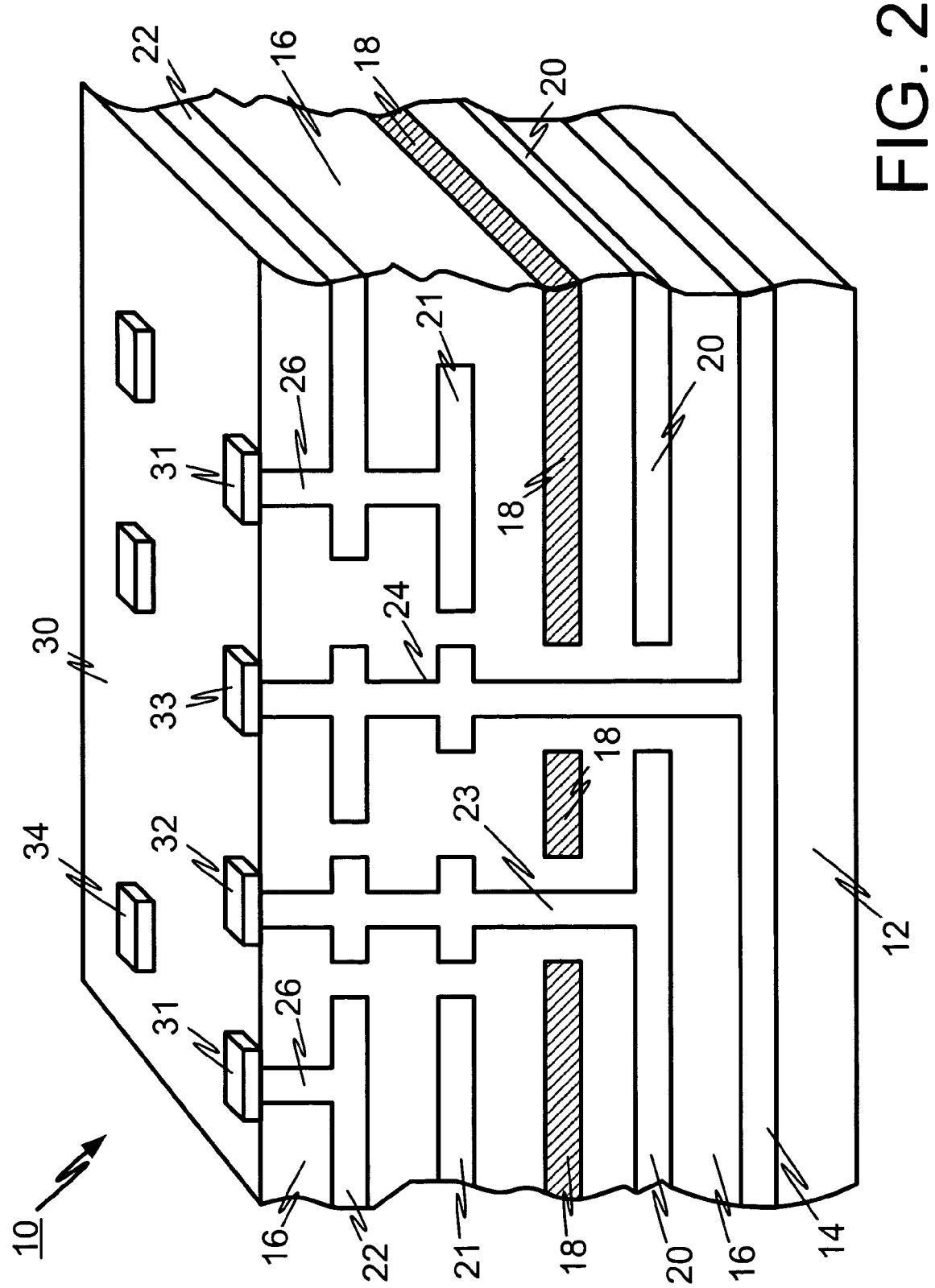
FIG. 2 is an isometric view of the partially broken-away apparatus shown in FIG. 1.

More particularly, the embodiment of FIGS. 1 and 2 shows a cut-away portion of an electrical circuit apparatus 10 which includes a base or substrate layer 12 of a dielectric and/or insulative material upon which is disposed a conductive layer 14 often of a metallic material. Above the first conductive layer 14 are one or more dielectric layers 16 having other functional layers 18, 20, 21 and 22, among various other reasonable numbers of possible such layers, disposed therebetween. As shown here, particularly as depicted by the functional layers 20, 21 and 22, various parts of these other functional layers may include conductive parts or traces disposed in varieties of patterns. These layers are often made, like layer 14, from conductive materials, often metallic, and may thus provide for conducting electricity therealong in selected patterns for particular applications. These layers 14, 20, 21 and 22 may thus define or be defined by one or more traces of conductive material in the formation of one or more comprehensive or partial electrical circuits within the apparatus 10. Connecting the traces in the layers 20, 21 and/or 22 with at least one other layer, as for example with the lower layer 14 and/or with one or more surface pads or terminals 31, 32, 33 and/or 34 and the like, see FIG. 2, are one or more vias or interconnect structures 23, 24 and/or 26 which, as shown here, provide vertical interconnections for the otherwise substantially horizontal trace layers 14, 20, 21, 22 and the surface pads or terminals 31, 32, 33, for example.

Note, the reference terms horizontal, vertical, upper, lower, above, below, and the like are intended merely to ease description of the embodiments in the drawings and are not intended to have any limiting effect on the ultimate orientations of the device(s) and/or apparatus(es) 10 or any of the parts thereof, as these may be disposed in various physical orientations during manufacture, storage, transportation, use and/or otherwise. Note also the dimensions in the drawings are not necessarily to scale; particularly the electrical conductive elements will often be very thin, as will many embodiments of the magnetic layer or layers.

At least one complete or substantially complete through hole via or interconnect structure 24 is shown in FIGS. 1 and 2, which reaches from the upper surface 30 of device 10 down through all of the intermediate dielectric layers 16 and conductive layers 20-22 to the base conductive layer 14. In some embodiments, these vias could reach further to the bottom surface of device 10. Such vias 24 thus provide electrical communication from layer 14 to the surface terminals, e.g., terminals 33 and the like. Additionally, these or like vias, though non-complete through hole vias could also, or only, as if they were buried, see below, communicate with and between traces on intermediate layers as described in further detail below. Partial via/interconnect structures 23 and 26 are also shown in the figures, e.g., FIGS. 1 and 2, to illustrate the alternative concept that vias may extend only partially in and/or through one or more of the respective dielectric and/or conductive layer(s) of the apparatus 10; thus providing electrical connectivity for a number of trace layers from between two layers to a reasonable number more. These other vias 23 and 26 may connect and thus communicate with surface terminals, e.g., terminals 30, 32 and/or these other vias 23, 26 may be buried (see below). The via holes, to accept a conductive material deposited therein, may be created by various means as by etching or by being drilled or punched through laminated or otherwise dielectrically created substrates. The conductive material thereof may be made or formed therein as by electroplating, deposition and/or other techniques, thus completing a multilayer interconnect structure(s) such as those shown and described here.

Three general types of trace layers are shown and described herein, including a reference layer (i.e., either a supply layer and/or a ground layer) and one or more signal layers. A supply layer is the layer which provides for supplying or distributing power to the various circuits or partial circuits in and/or connected to the apparatus 10. A ground layer is the power return or drain layer which may thus be cooperative with the supply layer in completing an overall circuit. Each of these supply and/or ground layers may alternatively be referred to generically as reference layers, or as supply and/or ground layers herein. One or more signal layers may also be included herein, and will generally be referred to as any of the electrically communicative layers which are not the supply or ground layers.

In the embodiments of FIGS. 1 and 2, the initial or base trace layer 14 could represent either the supply layer, as in a power supply or distribution layer or power supply or distribution plane. Alternatively, this base trace layer 14 could represent the ground layer or plane; wherein contrarily, and for a relative convention, the trace layer 22 could represent the opposing reference ground layer or plane, or alternatively the supply layer or plane. As such, completion of an overall circuit may be accomplished, inter alia, by connection through a further trace and/or component internal to the apparatus 10 or by connection of an external electrical connection, component or device, such as an exemplary further component or device like the device 40 (shown in phantom, dashed lines in FIG. 1) which could be connected across respective apparatus terminals 31, 33, for example. In such an example, such a connection could thus create a closed circuit for flow of electricity from a supply layer 14 (or to a ground layer 14), up (or down) through one or more vias 24 and/or 26 to and through the appropriate corresponding terminal(s) of and through the component 40 and back into device 10 through the appropriate terminal(s) 31 (or as shown through terminal 33). Note, the opposing reference layer, here layer 22, has corresponding vias 26 which could thus alternatively represent the supply layer 22 or the ground layer, and thus electric flow may similarly be described through the one or more appropriate vias 26 to the ground or from the supply layer (or plane) 22. In such an example, vias 24 may thus be referred to as supply or ground vias, and vias 26 may be opposingly referred to as ground or supply vias. An electrical circuit loop such as this may be completed within the apparatus 10 without an external component 40; as electrical and/or electronic componentry can be formed in, as in buried or embedded within the apparatus 10.

Figure 6:
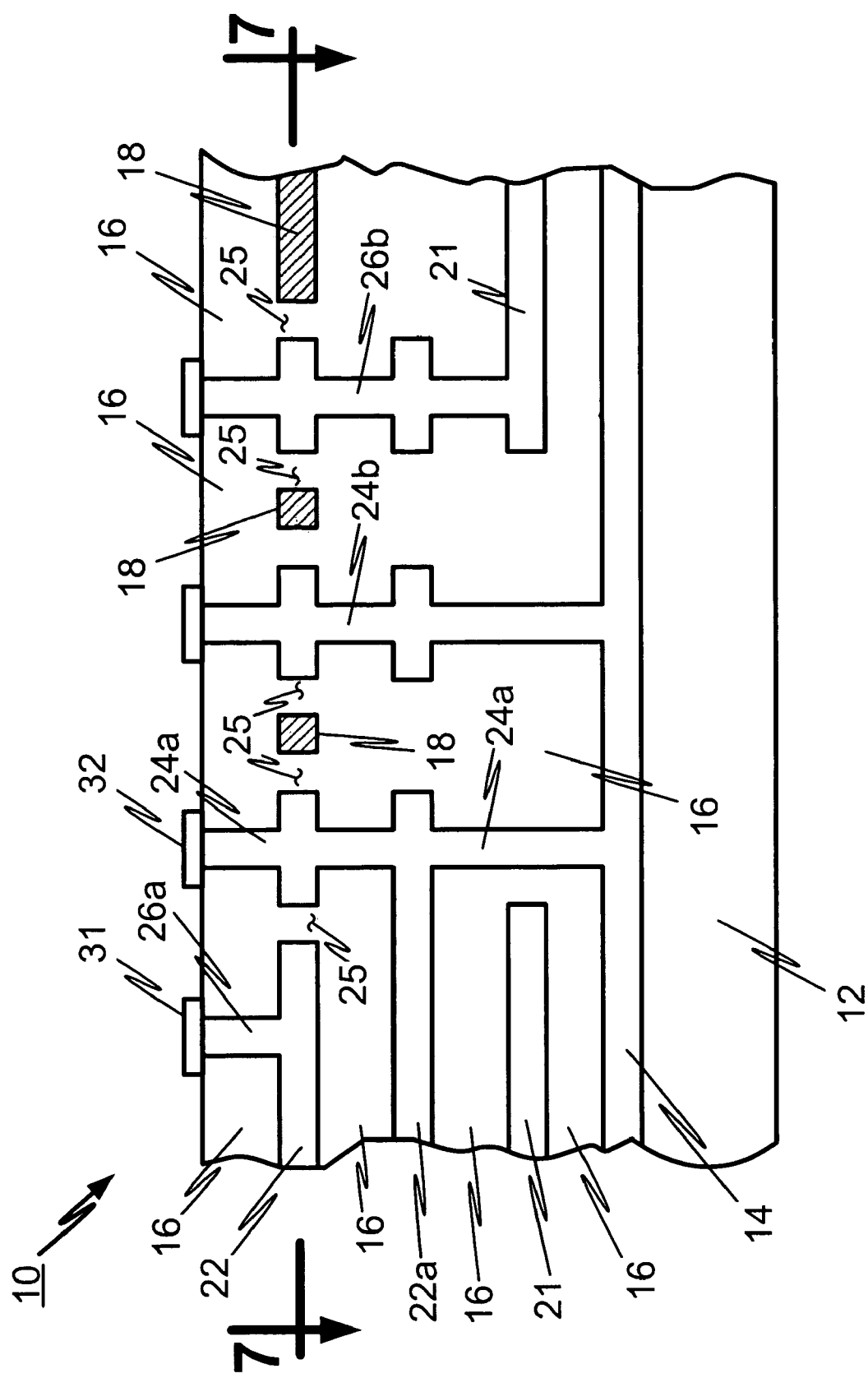
FIG. 6 is yet still one further partially broken-away, cross-sectional view of still yet another alternative exemplary embodiment of an electrical circuit apparatus having a magnetic layer buried therein; and, FIG. 7 is a sectioned plan view of the magnetic layer of the embodiment of FIG. 6 as taken along the lines 7-7 thereof; the cross-sectional view of the FIG. 6 embodiment similarly having been taken along the lines 6-6 of FIG. 7.

Note, the intermediate conductive layers 20, 21 also known as signal layers 20, 21 as shown in FIGS. 1 and 2 may have their own vias, such as via 23 connected to layer 20 and to terminal 32 on the surface 30 of the apparatus 10. In some alternatives, one or more of such signal layers 20, 21 could be connected directly to one of the reference vias, such as is shown for at least part of the layer 21 connected to a via 26. As such, one or more of the intermediate signal layers 20, 21 may thus also serve as an additional ground or drain layer or plane, though it may do so secondarily, the outer layers 14, 22 often being the primary ground and supply layers. Alternatively, the configuration may be the opposite, i.e., the intermediately disposed layers may be the primary ground and/or supply layers in one or more particular embodiments, e.g., layers 20, 21. Layers 20, 21 may in any case act independently and provide alternative electrical connections serving as purely signal layers, and not necessarily or primarily as reference, i.e., ground, or supply, or both, to various other circuit layers and/or elements connected thereto. In such cases, such additional layers 20, 21 may be referred to as signal layers. Additional reference, supply or ground, layers or planes could also be provided, above or below layers 20, 21 and/or 22, or above or below the other layers as well. As alternatively shown in FIG. 6 (see description, below), plural reference layers may be used, as will be described below. Note, in depicting the primary embodiments hereof, e.g., FIGS. 1 and 2, as well as in FIGS. 3 and 4, these FIGS. show only one power supply layer, namely, either of layers 14 or 22, here, with only one corresponding ground layer, either of the opposing layers 22 or 14. The plural supply layers of FIG. 6 are intended only to show an example of the variety of possible embodiments and are not intended to have any limiting effect on the numbers and/or kinds of layers which may be used in electrical apparatuses 10 compliant with the inventions hereof.

Note as further shown and indicated in FIG. 1, that where no electrical communication between adjacent conductive parts is desired in a particular layer, there may be defined a minimal gap or gaps 25 between an adjacent pad or pads 27 and/or trace(s) 29. The gaps 25 may be filled with a dielectric or insulative material which may be accomplished during formation of the one or more of the dielectric layers 16.

Layer 18 is, in the embodiments hereof, as, for example, in FIGS. 1 and 2, a magnetic layer including a magnetic material such as a ferrite. As such, layer 18 may provide by electromagnetic interaction, increased inductance in a loop between one or more supply vias, e.g., via 24 and a corresponding one or more signal vias, e.g. via 23. This increased inductance may help to compensate for the large capacitance created by pads (e.g., pads 27) and/or reference planes (e.g., planes or layers 14 and/or 22), and provide for an overall impedance closer to common target impedances. The present disclosure thus involves the inclusion of a buried layer of magnetic material 18 in an electrical circuit apparatus 10 such as a printed circuit board, inter alia, so as to increase the inductance of the loop between signal vias and reference vias. By adding a thin buried layer of magnetic material, such as a ferrite, the inductance of one or more of the vias, often more particularly of the signal via(s), can be significantly increased, with no effect on the capacitance. This effect, here, an increase of inductance will also affect the impedance and will bring the impedance of the desired via and/or the loop into balance. The inductance may be said to be increased relative to the via and/or to the circuit loop.

In some embodiments, the magnetic material 18 may be adapted by its disposition to be magnetized by the electromagnetic field(s) created by currents flowing along nearby trace(s) and/or via(s). Additionally, and/or alternatively, the magnetic material 18 can, once magnetized by this or previous exposure to a magnetic or electromagnetic charge or field, then provide its own magnetic field to interact with nearby or adjacent trace(s) and/or via(s). Most particularly, such a magnetic field, and/or the inherent magnetizability, of the magnetic layer 18 can then provide an inductance to the circuit loop, and perhaps more directly provide an inductance to the adjacent via or vias. Then, as introduced above, the increased inductance can then contribute to and thereby affect or otherwise provide a controlled or balanced impedance. In other words, the increased inductance can provide a desirable counter-balance to the otherwise large capacitances of some (or all) of the vias in the apparatus 10. Signals should then not be delayed as they might have been by such unchecked capacitances.

As both speeds and printed circuit board layer counts increase, the transmission line effects of through-hole vias become increasingly important. Impedance and propagation delay are the two primary characteristics of transmission lines, and the impedance may be the most important from a signal integrity point of view. Mismatched impedance may lead to reflections, which can cause errors and/or signal delays and a consequent inability to reach theoretically maximal speeds.

Noting that impedance is the square root of the ratio of inductance per unit length to capacitance per unit length, and that vias tend to have very large capacitances due to the effects of pads on the vias, and nearby reference planes, a desirable impedance may be achieved by either reducing the capacitance, or as shown and described here, by increasing the inductance. Thus, by increasing the inductance the impedance in the loop(s) will better match and thus reduce signal delays.

The concepts of the magnetic layer may be applied to various electrical circuit devices including many of those in or including a computer system; or a computer processor board or controller board or motherboard; or a daughter card; I/O or memory boards; a multi-chip module (MCM); a system on a chip (SOC) or other types of integrated circuit; or a flex circuit; or as mentioned, a printed circuit board.

Figure 3:
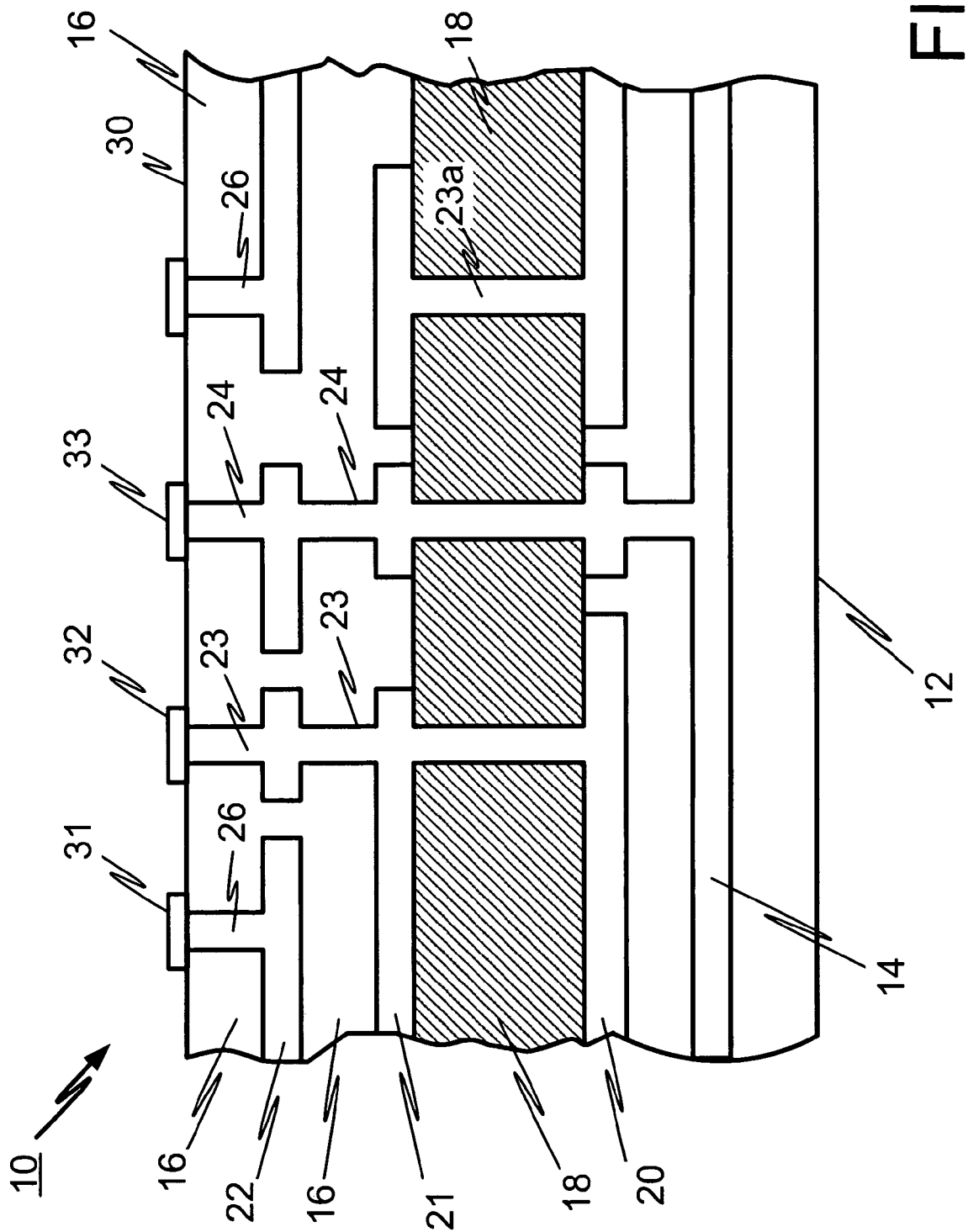
FIG. 3 is another partially broken-away, cross-sectional view of an alternative exemplary embodiment of an electrical circuit apparatus having a magnetic layer buried therein.

Moreover, the alternatives for the magnetic layer are not limited to alternative structures in which such a layer may be applied, but also includes where and how such a layer may be incorporated into a substrate or other part of an electrical apparatus. For example, contrary to being surrounded by dielectric material 16 as suggested by the embodiments of FIGS. 1 and 2, the magnetic layer 18 may instead fill the entire space between adjacent conductive layers as shown between layers 20, 21 in FIG. 3. Note, as the magnetic layer may not be electrically conductive, it may not have use for intervening dielectric spaces or gaps 16 or 25. Note, the scale of the embodiment of FIG. 3 is for effect in demonstrating or emphasizing visually the difference between the embodiments of FIGS. 1 and 3, not being indicative of the quantity or effective operative relationships in a working embodiment. Layer 18 may rather be thin in comparison with the other layers, e.g., as thin as or perhaps even thinner than the other layers. Following the convention of FIGS. 1 and 2, the intermediate layers 20, 21 of FIG. 3 may similarly be described as signal layers as opposed to reference layers; however, the very opposite convention may also be found in alternative embodiments, i.e., that the intermediate layers 20, 21 may represent the reference layers (power supply and ground) whereas the outer layers, layers 14 and 22 could then represent the signal layers.

Figure 4:
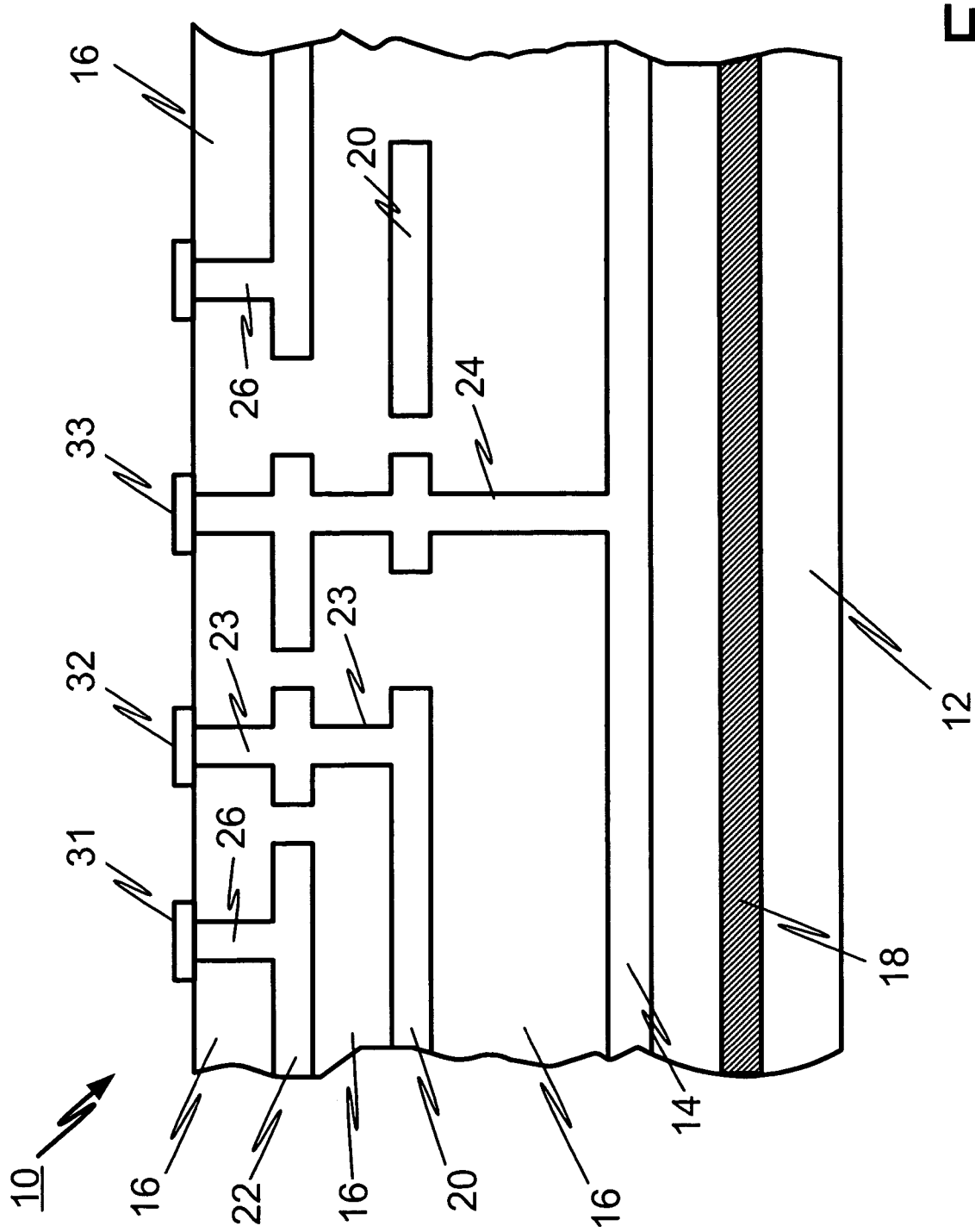
FIG. 4 is yet another partially broken-away, cross-sectional view of still one further alternative exemplary embodiment of an electrical circuit apparatus having a magnetic layer buried therein.
Figure 5:
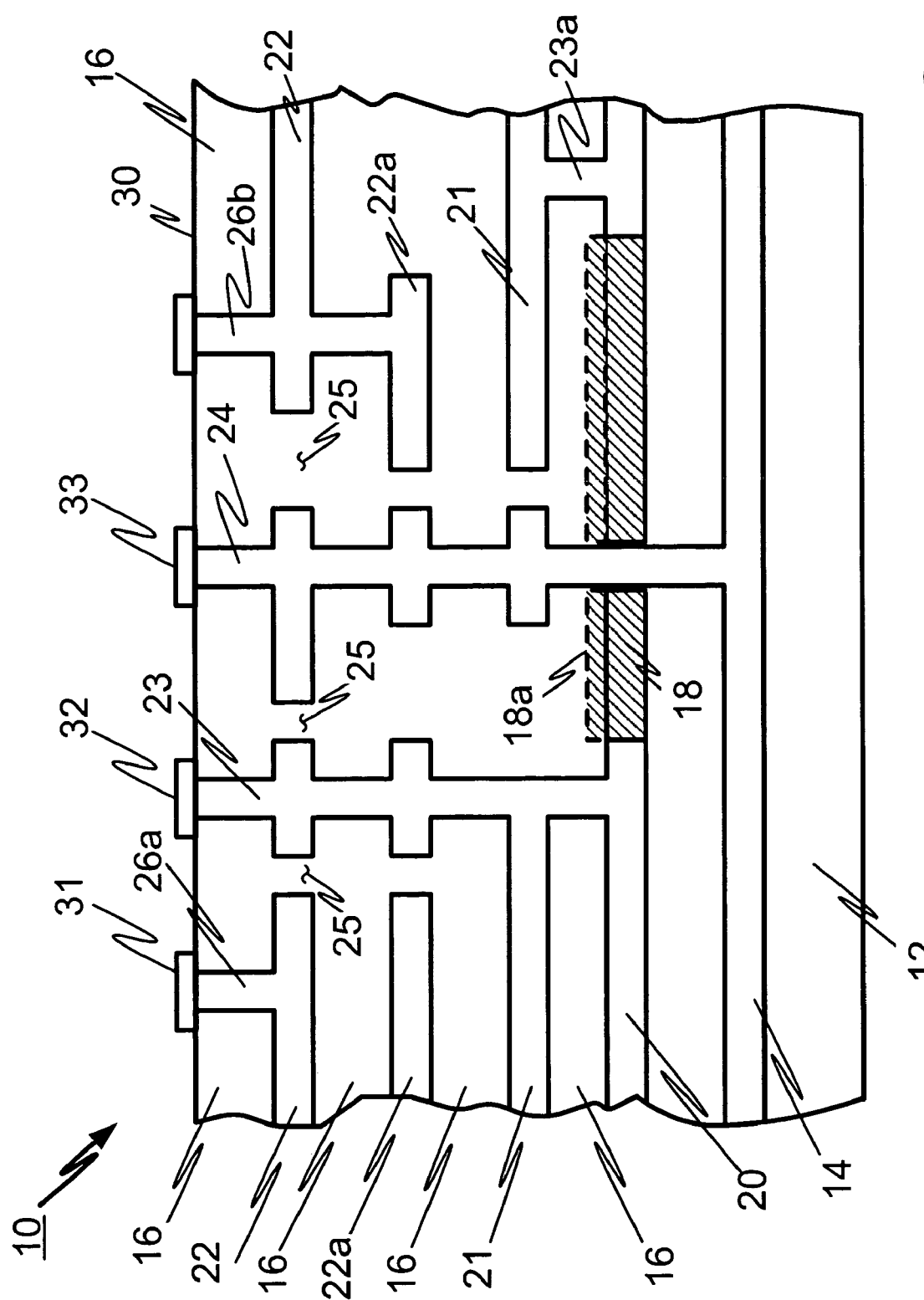
FIG. 5 is still one further partially broken-away, cross-sectional view of another alternative exemplary embodiment of an electrical circuit apparatus having a magnetic layer buried therein.

In another alternative, it may be that contrary to being disposed above the power supply layer 14 as shown in FIGS. 1 and 2, this magnetically active layer 18 may be disposed below the lower reference layer 14 as shown in FIG. 4. Or, layer 18 could be disposed in or about or around the same layer as the supply plane 14 or one or more of the signal layers, e.g., layer 20 as shown in FIG. 5, or any other layer such as the upper reference layer 22 as shown in FIG. 6. Other alternative layer placements could also be used, and/or multiple layer placements of a magnetic material may be incorporated in an apparatus hereof.

Figure 7:
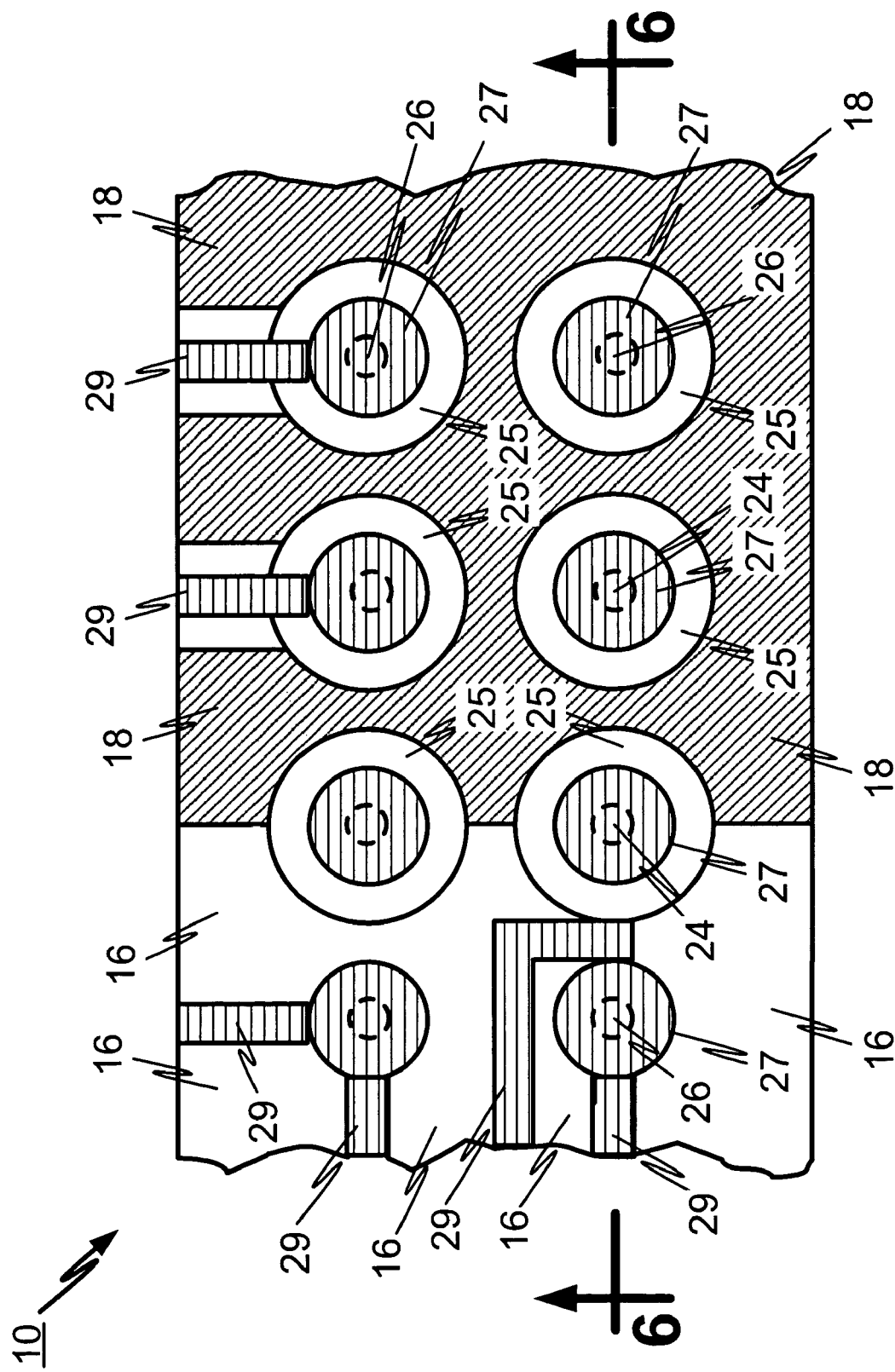

More particularly as shown by the examples in FIGS. 1-4, a layer 18 may be disposed throughout most, if not all of the width and/or breadth of a layer such as the substrate or base layer 12 as shown in FIG. 4; or the layer 18 may be dispersed in only a limited desired part or parts of the dielectric layer(s) or interstices between and/or within layers as depicted generally in FIGS. 5-7. Thus, as would be the case in FIGS. 1-4, the layer 18 could provide a desirable inductance applicable throughout a substantial amount, if not the entire width and depth of the apparatus or device 10, i.e., providing inductance for a plurality of the one or more possible whole or partial circuit loops disposed in a device 10, including increasing the relative inductance of a potential plurality of signal vias 23 as well as a potential plurality of reference vias 24, 26, e.g., supply and/or ground or drain vias 24 and/or 26. Alternatively, as shown in FIG. 5, as well as in FIGS. 6 and 7, a more limited disposition of the magnetic layer 18 may thus be disposed to provide an inductance which may be particularly situated to provide a desired impedance effect in only one or more particular vias, traces and/or loops, as, for example, vias 23, 23a and 24 in FIG. 5 and vias 24b and 26b. Whereas, on the other hand, such a limited layer 18 may provide little if any effect for the loop containing vias 24a and 26a. More particularly, it may be that selected vias are surrounded as, for example the via 24 in FIG. 5, so that the magnetic inductance provided by the layer 18 can act specifically in relation to that particular via, increasing the inductance presented by that via 24, for example, and thereby desirably reducing the impedance thereof relative to the remainder of the circuit. If the via 24 is a signal via, such an operative disposition may provide an often highly desirable result in an overall circuit, or the via 24 may be a reference via relative to a signal via. Similarly, in FIGS. 6 and 7, the inductive contribution to the impedance of the respective layers 18 of the embodiments of FIGS. 6 and 7 would primarily affect the circuit loops containing vias 24b and 26b as opposed to the circuit loops containing vias 24a and 26a.

Moreover, FIGS. 5 and 6 provide for additional description of other alternatives which are not intended to have any limiting effect on the scope of the invention; rather, only to show some of the many alternatives useful herewith. For example, although FIGS. 5 and 6 show alternative layer placements for the magnetic layer 18 as embedded within/adjacent the lower signal layer 20 (FIG. 5) or in the upper reference layer 22 (FIG. 6), alternatively, this layer 18 could be placed in any of the other layers (e.g., layers 14, 21, 22, 22a and the like) as well. In such cases, when layer 18 is disposed within the same layer as a conductive material, e.g., layer 14, 20, 21, 22 and/or 22a, the width and/or breadth of the magnetic layer 18 may, as shown in FIGS. 6 and 7, be limited by the extent of the alternative insulation/dielectric material (e.g., in gaps 25) and conductive traces 29 and/or pads 27 determined to be disposed in that particular layer. However, as the magnetic material of layer 18 may not be conductive, the layer 18 may instead, as shown in FIG. 5, fill all the space between adjacent conductive traces and/or pads in a particular layer.

Note the additional alternative layer 22a of FIGS. 5 and 6 is shown alternately connected to the reference via(s) 26b (in FIG. 5) and the reference via 24a (in FIG. 6). Intermediate layers 20, 21 may thus provide the signal capabilities in these embodiments, as well, being connected to signal vias 23 and 23a (in FIG. 5) and to signal via 26b (in FIG. 6). Note the depiction of an alternative buried via 23a in FIG. 5 (and also in FIG. 3) which connects the two signal layers, here, the layer 20 with the layer 21 thus providing both such layers with signal capacity in some embodiments, although as above, these layers 20, 21 could represent particular reference layers in some alternative embodiments. A further alternative indicated in the embodiment of FIG. 5 is an alternative thickening of the otherwise often thin layer 18 as shown by the phantom raised area 18a. Layer 18 could alternatively be thinner than the embodiments shown depending upon the amount of inductive effect desired. Note, in many embodiments, such as many those shown and described relative to FIGS. 1-6, the thickness or thinness of the particular layers such as the magnetic layer(s) 18 are often to be determined relative to the desired inductive effect, but may in any case be on the order of those layers which may be described as thin films or as created using thin film technologies, although such technologies are not limitative of the production methods used for any of the embodiments hereof. Alternatively, the thinness hereof may be on the order of thin buried capacitance layers used in printed circuit boards, however, again this is not meant to be limiting because the current layer(s) 18 may be thicker relative thereto. In some embodiments, a layer 18 may be on the order of about 2-4 mils.

The planar view of FIG. 7 shows the top planar view of an embodiment of a plurality of via pads 27 through which the respective vias 24, 26 may be connected and/or formed. Also shown are gaps 25 of insulative and/or dielectric material and a relative extent of an embodiment of a limited dispersion of a magnetic material 18 in a magnetic plane co-extant with the reference plane 22. In this embodiment, the magnetic material may be limited in planar extent for various reasons, as for example, as shown, there are also defined electrically conductive traces 29 in layer 22 of this same plane. Like the gaps 25 between the magnetic material 18 and the pads 27, appropriate gaps of dielectric material may, in some embodiments be disposed between the conductive traces 29 and the magnetic material 18.

The foregoing has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

Accordingly, what is claimed is:

1. A method for affecting an impedance of a portion of an electrical circuit loop in an electrical circuit apparatus comprising:

providing an electrical circuit apparatus having at least a portion of an electrical circuit loop including at least one of at least one trace and at least one via, the trace and the via operatively connected together to provide electrical communication therethrough, and dielectric material disposed in operative relationship adjacent at least one of the trace and the via;

providing a layer of a magnetic material disposed adjacent at least one of the trace and the via, whereby the layer of magnetic material is disposed in operative relationship near at least one of the trace and the via to affect the impedance of at least one of the trace, the via and the portion of the circuit loop formed by the trace one the via; and providing power to the electrical circuit apparatus, whereby during the providing of power, the layer of magnetic material affects the impedance of the at least one via.

2. The method according to claim 1 further comprising selecting the circuit apparatus from the group consisting of a computing system, a motherboard, a daughter card, a multi-chip module, an integrated circuit, a flex circuit, and a printed circuit board.

3. The method according to claim 1 wherein providing the layer of magnetic material further comprises forming the layer of magnetic material as a thin layer in relationship to a thickness of the electrical circuit apparatus.

4. The method according to claim 1 wherein providing the layer of magnetic material further comprises forming the layer of magnetic material as a thin layer using a thin film technology.

5. A method according to claim 1 wherein the step of providing the layer of magnetic material further comprises burying the layer of magnetic material in a relationship to the at least one trace, the at least one via and the dielectric material, the relationship selected from the group consisting of being buried in the dielectric material in non-contact relationship adjacent to the trace; being buried in the dielectric material in non-contact relationship adjacent to the via; being in contact relationship adjacent the trace; and being in contact relationship adjacent the via.

6. A method for affecting an impedance of a portion of an electrical circuit loop in an electrical circuit apparatus comprising providing an electrical circuit apparatus having at least a portion of an electrical circuit loop including at least one of at least one trace and at least one via, the trace and the via operatively connected together to provide electrical communication therethrough, and dielectric material disposed in operative relationship adjacent at least one of the trace and the via;

providing a layer of a magnetic material disposed adjacent at least one of the trace and the via, whereby the layer of magnetic material is disposed in operative relationship near at least one of the trace and the via to affect the impedance of at least one of the trace, the via and the portion of the circuit loop formed by the trace and the via; and providing power to the electrical circuit apparatus, whereby the at least one via is selected from the group consisting of a signal via and a reference via, and whereby during the providing of power, the layer of magnetic material affects the impedance of the at least one via selected from the group consisting of the signal via and the reference via.

7. The method according to claim 6 in which the providing of power includes using the reference via, whereby the using of the reference via includes supplying power through the reference via or grounding the circuit through the reference via.

8. A method for affecting an impedance of a portion of an electrical circuit loop in an electrical circuit apparatus comprising providing an electrical circuit apparatus having at least a portion of an electrical circuit loop including at least one of at least one trace and at least one via, the trace and the via operatively connected together to provide electrical communication therethrough, and dielectric material disposed in operative relationship adjacent at least one of the trace and the via;

providing a layer of a magnetic material disposed adjacent at least one of the trace and the via, whereby the layer of magnetic material is disposed in operative relationship near at least one of the trace and the via to affect the impedance of at least one of the trace, the via and portion of the circuit loop formed by the trace and the via; and providing power to the electrical circuit apparatus and the at least a portion of an electrical circuit, whereby the providing of power includes creating a magnetic field and whereby the creating of a magnetic field interacts with the magnetic layer creating an inductance in the at least a portion of the electrical circuit.

9. The method according to claim 8 wherein the creating of an inductance includes affecting the at least a portion of a circuit loop in a manner selected from the group consisting of increasing the inductance of the at least one via, and increasing the inductance of the at least one trace.

10. The method according to claim 8 wherein the creating of an inductance includes affecting the at least a portion of a circuit loop in a manner selected from the group consisting of having no effect on a capacitance of the at least one via; having no effect on a capacitance of the at least one trace; and having no effect on a capacitance of the circuit loop.

11. The method according to claim 8 wherein the creating of an inductance includes affecting the at least a portion of a circuit loop in a manner selected from the group consisting of balancing the impedance of the at least one trace, and balancing the impedance of the portion of the circuit loop.

12. The method according to claim 8 wherein the creating of an inductance includes affecting the at least a portion of a circuit loop in a manner selected from the group consisting of lowering the impedance of the at least one via, lowering the impedance of the at least one trace, and lowering the impedance of the portion of the circuit loop.

* * * * *

UNITED STATES PATENT AND TRADEMARK OFFICE
CERTIFICATE OF CORRECTION

PATENT NO. : 7,350,292 B2
APPLICATION NO. : 10/986642
DATED : April 1, 2008
INVENTOR(S) : Michael J. Tsuk It is certified that error appears in the above-identified patent and that said Letters Patent is hereby corrected as shown below:

In column 8, line 29, in Claim 1, delete "one" and insert -- and --, therefor.

In column 10, line 1, in Claim 8, after "and" insert -- the --.

Signed and Sealed this

Nineteenth Day of August, 2008

JON W. DUDAS
*Director of the United States Patent and Trademark Office*